US011205995B2

(12) United States Patent
Carlton et al.

(10) Patent No.: US 11,205,995 B2
(45) Date of Patent: Dec. 21, 2021

(54) FAST START-UP CRYSTAL OSCILLATOR

(71) Applicant: Intel Corporation, Santa Clara, CA (US)

(72) Inventors: Brent Carlton, Portland, OR (US); Hao Luo, Milpitas, CA (US); Somnath Kundu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/833,298

(22) Filed: Mar. 27, 2020

(65) Prior Publication Data
US 2021/0305939 A1  Sep. 30, 2021

(51) Int. Cl.
*H03B 5/06* (2006.01)
*H03B 5/12* (2006.01)
*H03B 5/36* (2006.01)

(52) U.S. Cl.
CPC ............. *H03B 5/06* (2013.01); *H03B 5/1262* (2013.01); *H03B 5/366* (2013.01); *H03B 2200/0094* (2013.01)

(58) Field of Classification Search
CPC ........ H03B 5/06; H03B 5/366; H03B 5/1262; H03B 5/32; H03B 2200/0094; H03L 7/24
See application file for complete search history.

(56) References Cited

U.S. PATENT DOCUMENTS

| 6,819,195 B1* | 11/2004 | Blanchard | H03B 5/06 331/158 |
| 9,246,435 B1* | 1/2016 | Kavousian | H03L 7/00 |
| 2019/0305786 A1* | 10/2019 | Zhang | H03L 7/24 |

OTHER PUBLICATIONS

Esmaeelzadeh, Hani et al., "A Quick Startup Technique for High-Q Oscillators Using Precisely Timed Energy Injection", IEEE Journal of Solid-State Circuits, vol. 53, No. 3, Mar. 2018, 11 pgs.
Megawer, Karim M. et al., "a 54MHz Crystal Oscillator with 30x Start-Up Time Reduction Using 2-Step Injection in 65nm CMOS", ISSCC 2019, Session 18, Analog Techniques, 18.5, 3 pgs.
Verhoef, Bram et al., "A 32MHz Crystal Oscillator with Fast Start-up Using Synchronized Signal Injection", ISSCC 2019, Session 18, Analog Techniques, 18.6, 3 pgs.

* cited by examiner

*Primary Examiner* — Jeffrey M Shin
(74) *Attorney, Agent, or Firm* — Schwabe, Williamson & Wyatt, P.C.

(57) ABSTRACT

An apparatus injects a start clock to a crystal at the beginning to increase an overall start up speed of the crystal. The apparatus relies on an impedance change inside the crystal itself instead of searching for a synchronization on the yet small crystal oscillation. The apparatus includes an oscillator (separate from the crystal) to search for the crystal's resonance frequency by detecting the crystal's impedance change. Once the frequency of the oscillator matches the crystal's resonance, there is significant change in the crystal's impedance. Using that information, the apparatus can lock the oscillator frequency at the crystal resonance frequency and inject the clock with high efficiency.

13 Claims, 5 Drawing Sheets

FAST START-UP CRYSTAL OSCILLATOR

BACKGROUND

Crystal oscillator is widely used in almost all systems which require accurate system clock. Because of the physical limit, crystal can't be cut into too small size, the resonance frequency of those crystals is relatively low, usually in the tens of megahertz. For such range of frequency, crystal oscillator need hundreds of microsecond or even millisecond to build up stable constant oscillation. During this oscillation start up time, system's performance is not guaranteed. So it requires system to wait for the oscillator after wake up. Thus, for systems which need to frequently go to sleep to save power, such as mobile devices, the crystal oscillator is still kept on while the system is in sleep. This enables the system to quickly recover full function after waking up. But the always-on (AON) crystal oscillator prevents the system to go further into deep power saving mode(s).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
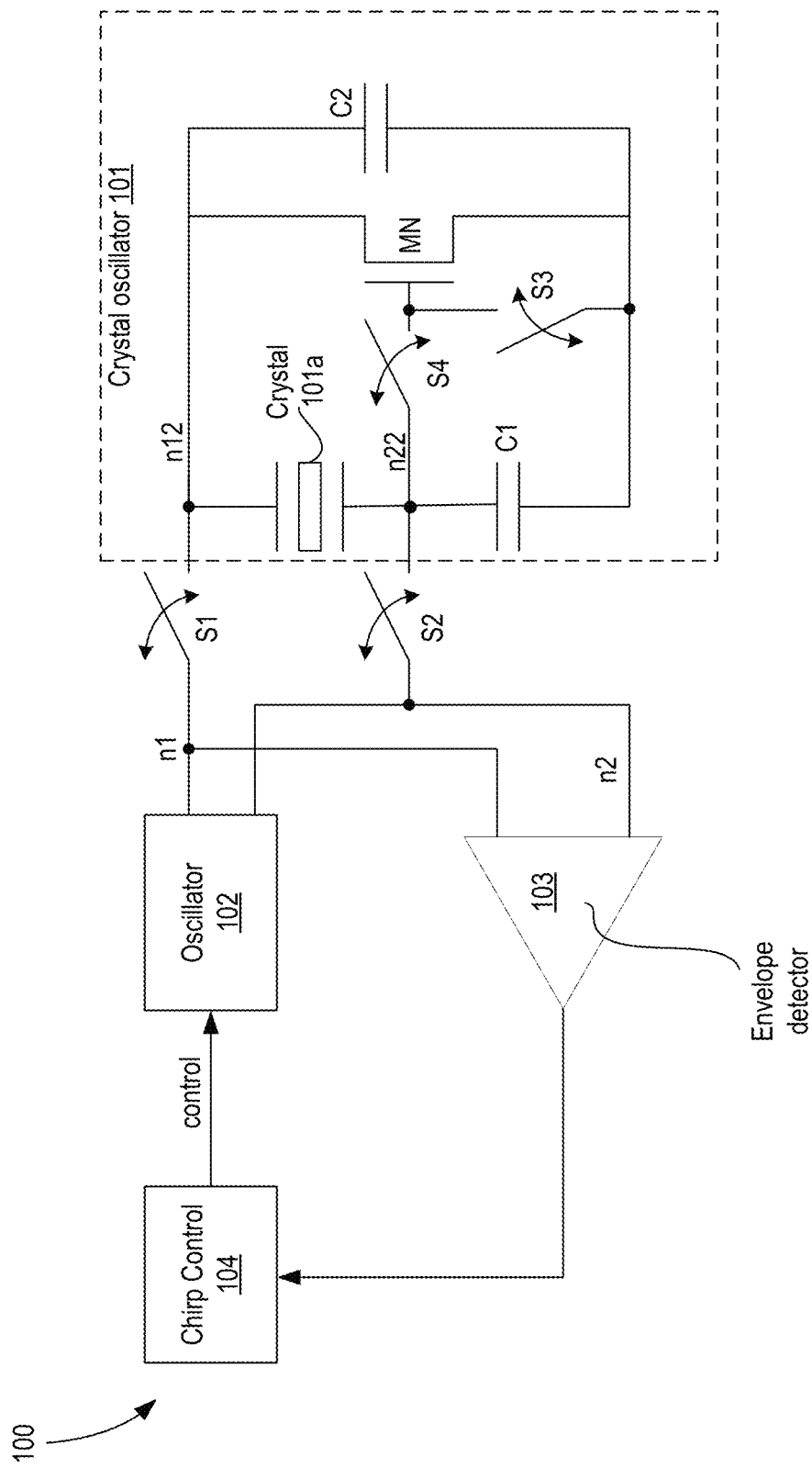
FIG. 1 illustrates an architecture of an apparatus for fast startup of a crystal, in accordance with some embodiments.

The apparatus and scheme of various embodiments inject a startup clock to a crystal at the beginning of its being powered on to increase an overall startup speed of the crystal. In some embodiments, the apparatus relies on an impedance change inside the crystal itself instead of searching for a synchronization on the yet small crystal oscillation at the time of startup. In some embodiments, the apparatus includes an oscillator (separate from the crystal) to search for the crystal's resonance frequency by detecting the crystal's impedance change. Once the frequency of the oscillator matches the crystal's resonance, there is significant change in the crystal's impedance. Using that information, the apparatus can lock the oscillator frequency at the crystal resonance frequency and inject the clock in to the crystal with high efficiency.

There are many technical effects of the various embodiments. For example, the apparatus allows the crystal oscillator to be quickly turned on from a power down mode (or low power mode) to full scale oscillation. As such, the crystal can be shut down during system sleep. The fast startup crystal oscillator enables a system (e.g., a system-on-chip, processor, processor platform, etc.) to save even more power during sleep and may not delay the whole system's wakeup time. The apparatus of various embodiments solves the slow wakeup time issue for a typical crystal oscillator. The apparatus significantly reduces the oscillator's startup time by, for example, 10× to 100×, faster than a regular oscillator. The simple architecture also results in low power. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates architecture 100 of an apparatus for fast startup of a crystal, in accordance with some embodiments. Architecture 100 comprises crystal oscillator 101 (e.g., a Pierce oscillator) and apparatus including oscillator 102, envelope detector 103, chirp control 104, first switch S1, and second switch S2 coupled as shown. Crystal oscillator 101 comprises quartz crystal 101a, series capacitor C1, transistor MN, switches S3 and S4, and parallel capacitor C2 coupled as shown.

In some embodiments, chirp control 104 generates a control for oscillator 102. In some embodiments, chirp control 104 includes a digital-to-analog converter that takes a digital code as input and converts it to an analog control for oscillator 102. The value of the digital code is slightly increased (e.g., by one bit at a time) to cause the analog control voltage to change by a fine amount. The control adjusts the oscillating frequency of oscillator 102. In some embodiments, when oscillator 102 is a voltage controlled oscillator (VCO), control is an analog voltage that changes the bias of each delay cell of the oscillator, and hence its delay and oscillating frequency. In some embodiments, chirp control 104 receives a digital code (e.g., a binary code) and converts it to a thermometer code which is applied as a control code to oscillator 102. In some embodiments, oscillator 102 receives a binary code. In other embodiments, other types of encoded codes can be used.

In some embodiments, oscillator 102 is an LC oscillator and the control is an analog voltage or a digital signal that changes the tuning voltage of the LC oscillator and hence the oscillating frequency of the LC oscillator. In some embodiments, oscillator 102 is a ring oscillator. In some embodiments, when oscillator 102 is a digitally controlled oscillator (DCO), control is a digital code (two or more bits) to change the delay of each delay cell and hence the oscillating frequency of the DCO. The various embodiments are not limited to any particular type of oscillator, and thus any type of oscillator can be used which is configured to have an adjustable oscillation frequency.

In some embodiments, for fast crystal wakeup, switches S1 and S2 are closed and nodes n1 and n12 are connected, and nodes n2 and n22 are connected. Switch S3 is closed to turn off the main oscillator driver so that the drain of transistor MN presents high impedance. Switch S4 is opened to disconnect main oscillator driver from resonator while searching for resonant frequency. Chirp control 104 generates a sweeping control that ramps up (or down) the oscillating frequency of oscillator 102. This oscillating signal on node n1 is provided to node n12, and hence crystal 101a. The beginning frequency of the chirp signal (or oscillating signal on node n2) is slightly higher than the crystal's resonance frequency and signal's frequency decreases during chirping. Here, the term chirping generally refers to a frequency sweep of signal on node n1 (by oscillator 102).

Oscillator 102 is designed so that its chirping frequency range covers the resonance frequency of crystal oscillator 101. Because the driver (e.g., oscillator 102) of the chirping signal has moderate or high impedance compared to resonator at resonance, when the oscillating frequency on node n1 approaches the crystal resonance frequency, due to the significant change in the impedance of crystal 101a, the signal's amplitude across the crystal 101a will have a major change. For example, the impedance between nodes n12 and n22 significantly dips when oscillating frequency on node n1 approaches the crystal resonance frequency.

In various embodiments, this envelop signal dip between nodes n12 and n22 is captured by envelop detector 103. Upon detecting the envelop signal dip, envelop detector 103 tells chirp generator 104 to stop oscillator 102 from chirping. In one such embodiment, the oscillating frequency of oscillator 102 is then held at the crystal's resonance frequency and switches S1 and S2 remain closed to inject oscillating signal to nodes n12 and n22. In some embodiments, an offset can be introduced in the oscillator control to overcome any systematic offsets. Offset can be used to generate higher (or better) accuracy in the injection frequency, which may improve startup speed of crustal 101. Higher drive strength at output of oscillator 102 can be used to decrease the amount of time required for startup. After certain period of time (which can be programmable or predetermined), the two switches S1 and S2 are turned off, switch S4 is closed and switch S3 is opened and crystal oscillator 101 starts to work by itself. Because crystal 101a has already built up energy quickly during the previous clock injection by oscillator 102 at resonance frequency of crystal 101a, the overall oscillation of crystal oscillator 101 startup time is much shorter than it would otherwise be.

During resonance detection mode, oscillator 102 drives with low strength to allow for voltage swing variation to be large when resonance is detected. By driving with high impedance, the energy injected during search mode is low and may not corrupt the resonance measurement with residual energy in the resonator. During injection phase a strong drive strength is used to quickly inject energy to resonator 101.

In various embodiments, architecture 100 may not need an accurate clock seed, as needed in the traditional crystal oscillator startup to start an initial oscillation. Thus, architecture 100 is insensitive to any variations in the auxiliary oscillator 102. As long as the starting frequency of oscillator 102 is above the crystal's resonance and the chirping range of oscillator 102 covers the resonance of crystal 101a, architecture 100 will automatically find the resonance of crystal oscillator 101 and lock the oscillating frequency of oscillator 102. One way to lock the oscillating frequency of oscillator 102 is by freezing the digital code (control) or by fixing the analog voltage (control) to oscillating 102. After some pre-determined or programmable wait time switches S1 and S2 are opened. In some embodiments, when a processor or system-on-chip (SoC) that uses the clock from crystal oscillator 101 enters a deep sleep state (or another low power state), crystal 101a can be turned off. When the processor or SoC wakes up, switches S1, S3 and S2 are closed with switch S4 open and the process of fast startup of oscillator 101 begins again.

In various embodiments, the switches S1, S2, S3, and S4 are implemented as transistors with source/drain terminals coupled to nodes (e.g., nodes n1, n12, and n2 and n22). The gate terminals of these transistors are controlled by control signals generated by a finite state machine (FSM). The FSM can be part of chirp control 104 or a separate logic for the SoC. In various embodiments, the capacitors C1 and C2 can be implemented as discrete capacitors, transistor based capacitors, metal-insulator-metal (MIM) capacitors, ferro-electric capacitors, etc.

In some embodiments, oscillator 102, envelope detector 103, chirp control 104, switches S1, S2, S3 and S4, and the FSM are on-die while crystal oscillator 101 is off-die. In some embodiments, crystal oscillator 101 is on-package of the SoC comprising oscillator 102, envelope detector 103, chirp control 104, switches S1 and S2, and the FSM. In some embodiments, oscillator 102, envelope detector 103, chirp control 104, switches S1 and S2, and the FSM are powered by an always-on (AON) power supply so that these components can jump start oscillator 101 when/if oscillator 101 is turned off in deep sleep or very low power state.

Architecture 100 may not detect the edge of the injecting signal to make synchronization, instead, it detects the crystal's signal envelop. Thus, architecture 100 may not need a high speed circuit, such as comparator for envelope detector 103. However, a comparator or amplifier may be used for envelope detector 103. A relative low power low speed envelop detector 103 can generally fulfill this purpose. This results less starting power needed.

Figure 2:
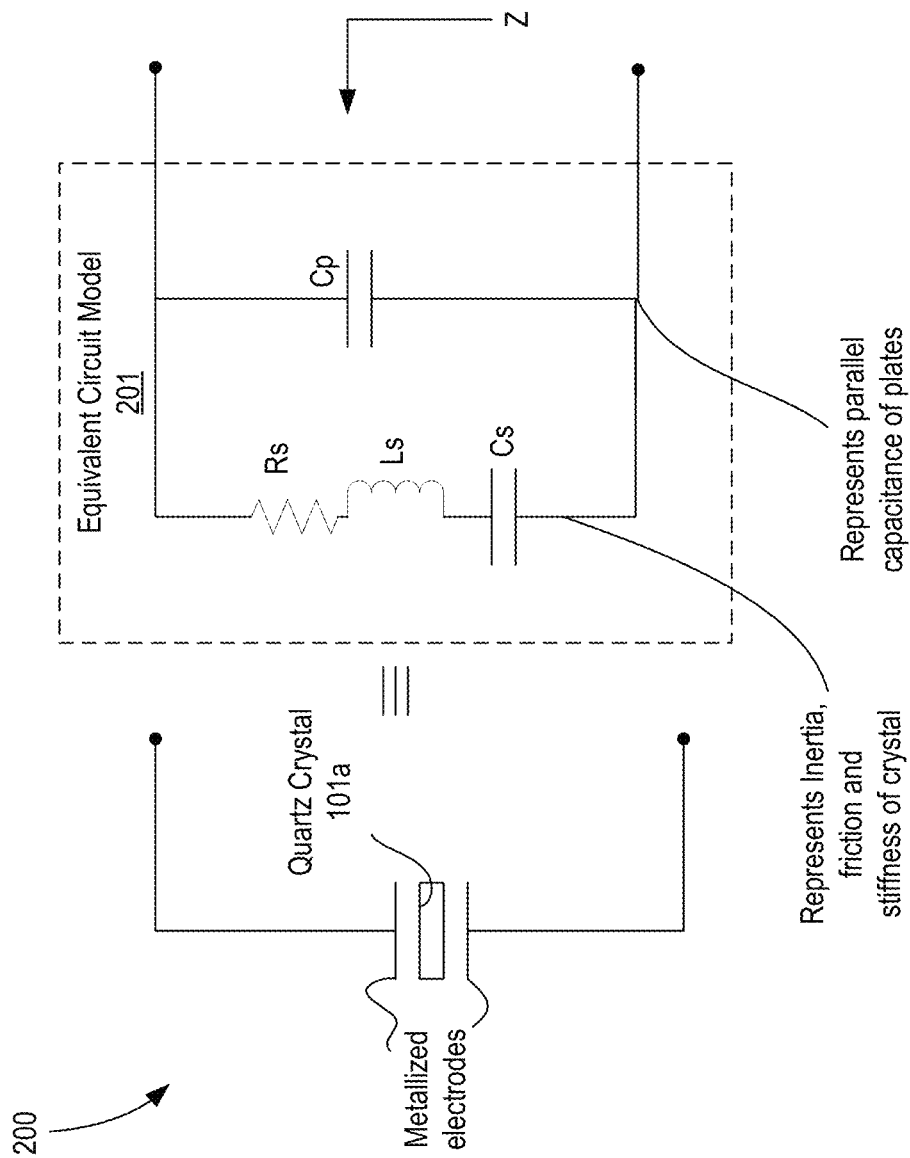
FIG. 2 illustrates a crystal equivalent model.
Figure 3:
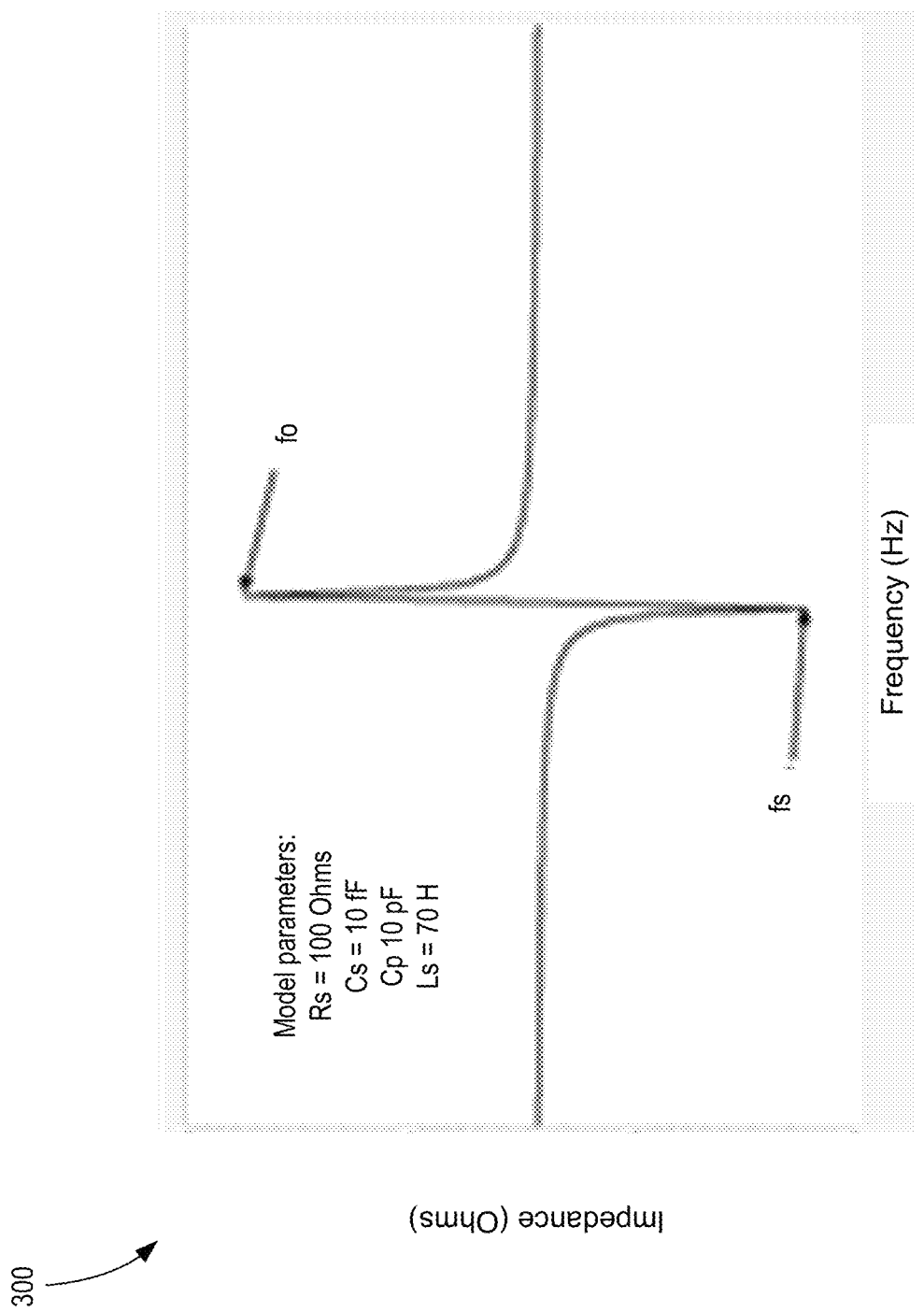
FIG. 3 illustrates a plot showing impedance of a crystal vs. frequency.

FIG. 2 illustrates a crystal equivalent model 200. The equivalent model 201 includes a series resistor Rs, series inductor Ls, series capacitor Cs, and parallel capacitor Cp. The impedance Z seen into equivalent model 201 is illustrated as a function of frequency on FIG. 3. FIG. 3 illustrates plot 300 showing impedance of a crystal vs. frequency. Near the resonant frequency (e.g., between fs and fo) of crystal 101a, the impedance suddenly dips. This dip in impedance is sensed by envelope detector 103. Upon detection of this sudden impedance change, envelope detector 103 asserts its output (or de-asserts its output in another embodiment) to inform an FSM and/or chirp generator 104 to freeze the control to oscillator 102.

Figure 4:
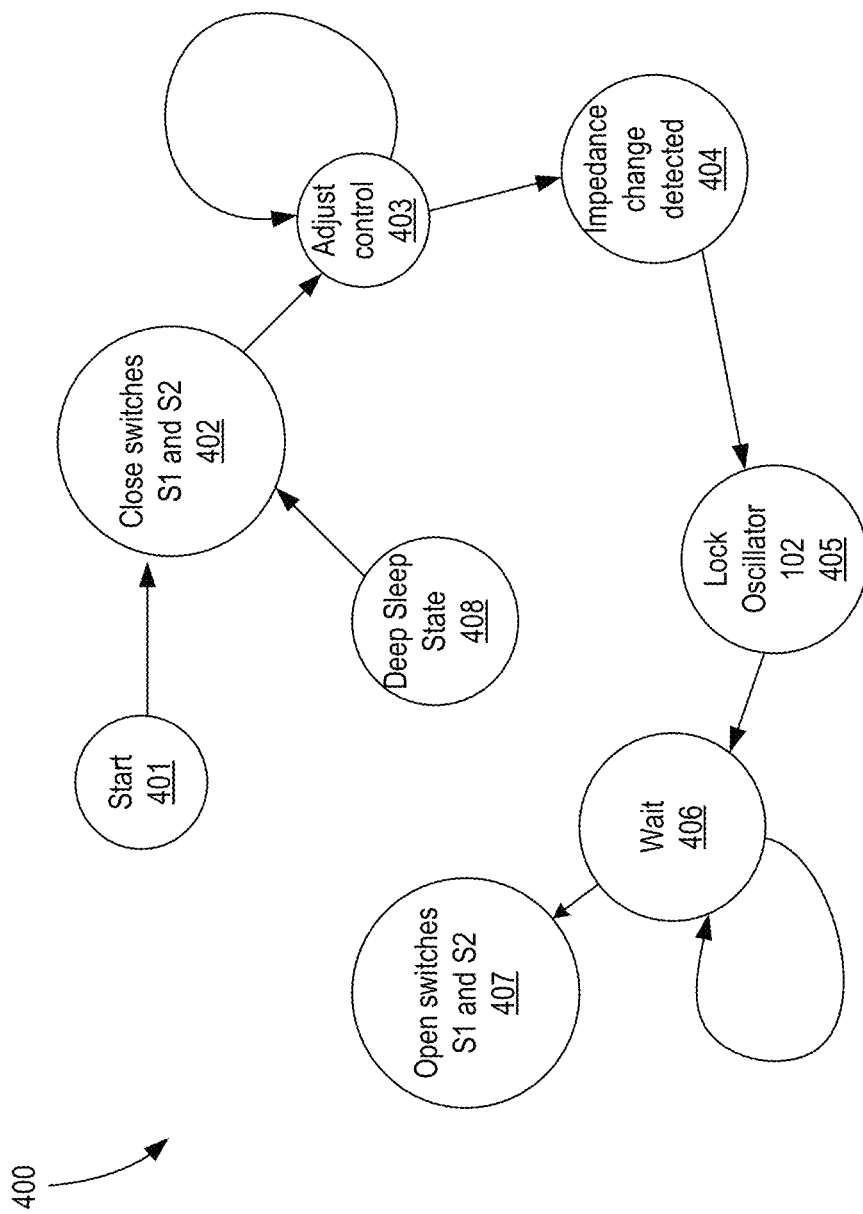
FIG. 4 illustrates a finite state machine diagram to operate the apparatus, in accordance with some embodiments.

FIG. 4 illustrates finite state machine (FSM) diagram 400 to operate the apparatus, in accordance with some embodiments. FSM 400 begins with the start state 401 which proceeds to state 402. In state 402, gate control signals are generated that close switches S1 and S2 (e.g., the switches are turned on). As such, oscillator 102 and envelope detector 103 are connected to crystal oscillator 101. The FSM then proceeds to state 403. In state 403, chirp control generator 104 adjusts the control (e.g., analog or digital) that adjusts the frequency of signal from oscillator 102. The adjustment of the control continues till the frequency of oscillator 102 is substantially equal or equal to the resonant frequency of quartz crystal 101a. The FSM then moves to state 404 where envelope detector 103 detects a sudden change in impedance of crystal oscillator 101 as illustrated by plot 300.

The FSM then proceeds to state 405 where the FSM locks oscillator 102 by freezing the control to oscillator 102 that sets the oscillating frequency of oscillator 102. The switches S1 and S2 remain closed for some time. This time can be programmable (e.g., by software, hardware, and/or firmware) or predetermined time. After waiting for such time, as indicated by state 406, the FSM proceeds to state 407 where switches S1 and S2 are opened (e.g., turned off) and crystal 101 is allowed to oscillate as normal. In some embodiments, when the processor or system enters a deep sleep state, it causes the crystal oscillator 101 to turn off as indicated by state 408. When in state 408 and the processor or system leaves the deep sleep state or any power state that causes the processor to turn off crystal 101, FSM 400 then proceeds from state 408 to state 402.

Figure 5:
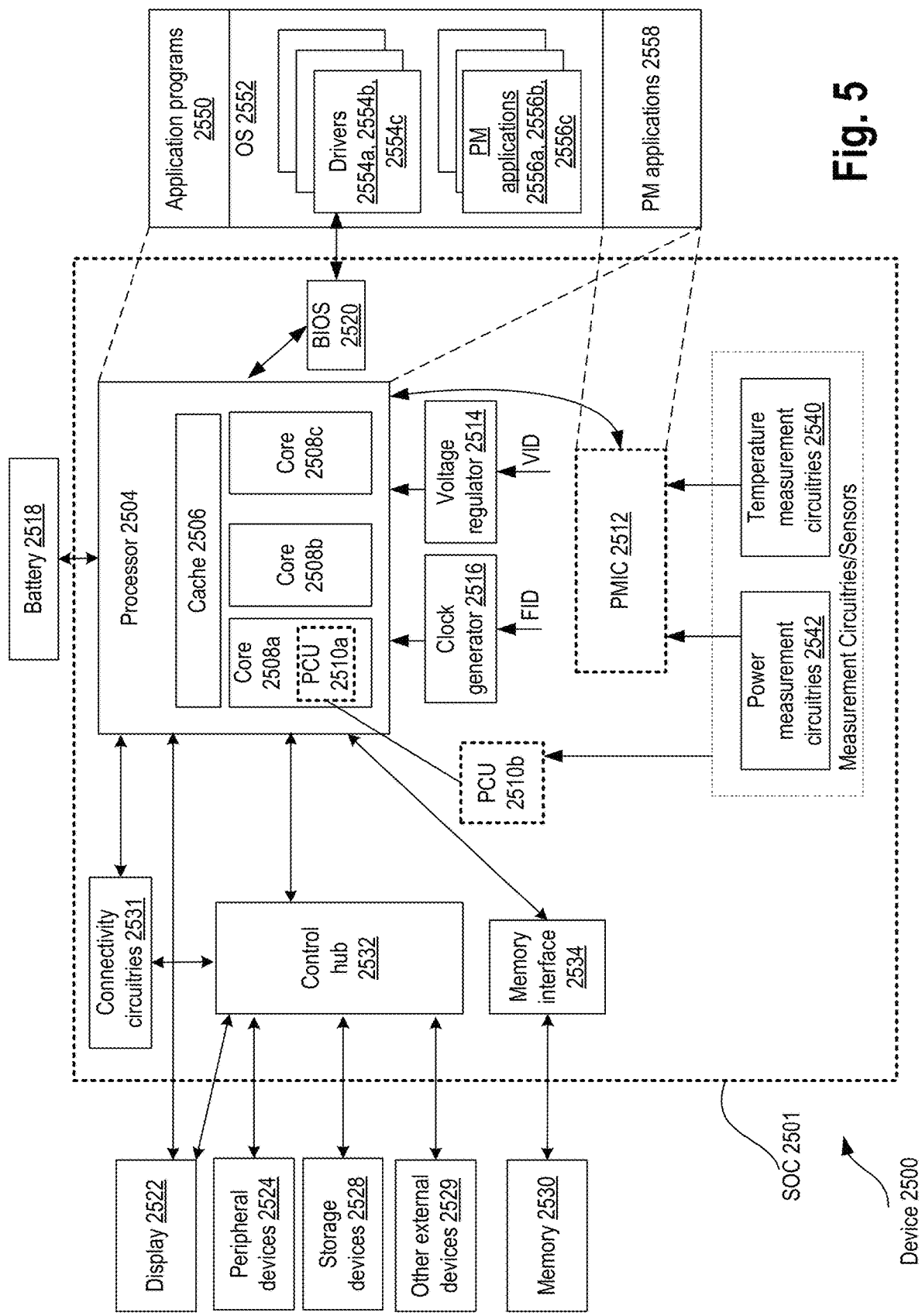
FIG. 5 illustrates a smart device, or a computer system, or a SoC (System-on-Chip) with apparatus for fast startup of a crystal, according to some embodiments of the disclosure.

FIG. 5 illustrates a smart device, or a computer system, or a SoC (System-on-Chip) with apparatus for fast startup of a crystal, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have apparatus for fast startup of a crystal of various embodiments.

In an example, the device 2500 comprises a SoC (System-on-Chip) 2501. An example boundary of the SOC 2501 is illustrated using dotted lines in FIG. 5, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508*a*, a second section of cache 2506 dedicated to core 2508*b*, and so on). In an example, one or more sections of cache 2506 are shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions are fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508$a$, 2508$b$, 2508$c$, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510$a$/$b$ and/or PMIC 2512. In some embodiments, each core has a network of distributed LDOs to provide efficient control for power management. The LDOs can be digital, analog, or a combination of digital or analog LDOs.

The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a first oscillator to generate a signal with a frequency; a control circuitry to generate a control for the first oscillator, wherein the control determines the frequency of the first oscillator; a second oscillator comprising a crystal; and a detector coupled to the first oscillator and the second oscillator, wherein the detector detects a sudden impedance change across the crystal.

Example 2: The apparatus of example 1 comprising a first switch coupled to the first oscillator and the second oscillator.

Example 3: The apparatus of example 2 comprising a second switch coupled to the first oscillator, second oscillator, and the detector.

Example 4: The apparatus of example 1, wherein the detector comprises an envelope detector.

Example 5: The apparatus of example 1, wherein the detector comprises a comparator.

Example 6: The apparatus of example 3 comprising a finite state machine (FSM) to control the first and second switches, wherein the FSM is to close the first and second switches to startup the second oscillator.

Example 7: The apparatus of example 6, wherein the FSM is to cause the oscillator to freeze the frequency in response to an indication from the detector that a sudden impedance change across the crystal is detected.

Example 8: The apparatus of example 7, wherein the FSM is to wait for a predetermined or programmable time after the FSM is to cause the oscillator to freeze the frequency.

Example 9: The apparatus of example 8, wherein the FSM is to open the first and second switches after the FSM is to wait for a predetermined or programmable time.

Example 10: The apparatus of example 1, wherein the first oscillator is a voltage controlled oscillator, and wherein the control is an adjustable analog signal.

Example 11: The apparatus of example 1, wherein the first oscillator is a digitally controlled oscillator, and wherein the control is an adjustable digital signal.

Example 12: An apparatus comprising: a crystal oscillator; and a startup circuitry coupled to the crystal oscillator, wherein the startup circuitry is to inject a signal with a first frequency into the crystal oscillator, wherein the startup circuitry is to stop injection of the signal into the crystal oscillator after a first frequency is substantially equal to a second frequency of the crystal oscillator, wherein the second frequency is a resonant frequency of the crystal oscillator.

Example 13: The apparatus of example 12, wherein the startup circuitry is to detect a sudden change in impedance across a crystal of the crystal oscillator.

Example 14: The apparatus of example 13, wherein the startup circuitry is to stop injection of the signal into the crystal oscillator upon detection of the sudden change in impedance across a crystal of the crystal oscillator.

Example 15: The apparatus of example 13, wherein the startup circuitry includes an envelope detector detect a sudden change in impedance across a crystal of the crystal oscillator.

Example 16: The apparatus of example 12, wherein the startup circuitry includes an oscillator to generate the signal with the first frequency.

Example 17: A system comprising: a memory; a processor coupled to the memory; and a crystal oscillator coupled to the processor, wherein the crystal oscillator includes a crystal, and wherein the processor includes a startup circuitry which comprises: a ring oscillator to generate a first signal with a frequency; a control circuitry to generate a control for the ring oscillator, wherein the control circuitry determines the frequency of the ring oscillator; a detector coupled to the oscillator and the crystal oscillator, wherein the detector detects a sudden impedance change across the crystal.

Example 18: The system of example 17, wherein the crystal oscillator is on package.

Example 19: The system of example 17, wherein the processor comprises: a first switch coupled to the ring oscillator and the crystal oscillator; a second switch coupled to the ring oscillator, crystal oscillator, and the detector; and a finite state machine (FSM) to control the first and second switches, wherein the FSM is to close the first and second switches to startup the crystal oscillator.

Example 20: The system of example 19, wherein: the FSM is to cause the ring oscillator to freeze the frequency in response to an indication from the detector that a sudden impedance change across the crystal is detected; the FSM is to wait for a predetermined or programmable time after the FSM is to cause the ring oscillator to freeze the frequency; and the FSM is to open the first and second switches after the FSM is to wait for a predetermined or programmable time.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a first oscillator to generate a signal with a frequency;
a control circuitry to generate a control for the first oscillator, wherein the control determines the frequency of the first oscillator;
a second oscillator comprising a crystal;
a detector coupled to the first oscillator and the second oscillator, wherein the detector detects a sudden impedance change across the crystal;
a first switch coupled to the first oscillator and the second oscillator;
a second switch coupled to the first oscillator, second oscillator, and the detector; and
a finite state machine (FSM) to control the first and second switches, wherein the FSM is to close the first and second switches to start up the second oscillator, wherein the FSM is to cause the first oscillator or the second oscillator to freeze the frequency in response to an indication from the detector that a sudden impedance change across the crystal is detected.

2. The apparatus of claim 1, wherein the detector comprises an envelope detector.

3. The apparatus of claim 1, wherein the detector comprises a comparator.

4. The apparatus of claim 1, wherein the FSM is to wait for a predetermined or programmable time after the FSM is to cause the first oscillator or the second oscillator to freeze the frequency.

5. The apparatus of claim 4, wherein the FSM is to open the first and second switches after the FSM is to wait for a predetermined or programmable time.

6. The apparatus of claim 1, wherein the first oscillator is a voltage-controlled oscillator, and wherein the control is an adjustable analog signal.

7. The apparatus of claim 1, wherein the first oscillator is a digitally controlled oscillator, and wherein the control is an adjustable digital signal.

8. An apparatus comprising:
a crystal oscillator; and
a startup circuitry coupled to the crystal oscillator, wherein the startup circuitry is to inject a signal with a first frequency into the crystal oscillator, wherein the startup circuitry is to stop injection of the signal into the crystal oscillator after a first frequency is substantially equal to a second frequency of the crystal oscillator, wherein the second frequency is a resonant frequency of the crystal oscillator;
wherein the startup circuitry is to detect a sudden change in impedance across a crystal of the crystal oscillator, wherein the startup circuitry is to stop injection of the signal into the crystal oscillator upon detection of the sudden change in impedance across a crystal of the crystal oscillator.

9. The apparatus of claim 8, wherein the startup circuitry includes an envelope detector to detect a sudden change in impedance across a crystal of the crystal oscillator.

10. The apparatus of claim 8, wherein the startup circuitry includes an oscillator to generate the signal with the first frequency.

11. A system comprising:
a memory;
a processor coupled to the memory; and
a crystal oscillator coupled to the processor, wherein the crystal oscillator includes a crystal, and wherein the processor includes a startup circuitry which comprises:
a ring oscillator to generate a first signal with a frequency;
a control circuitry to generate a control for the ring oscillator, wherein the control circuitry determines the frequency of the ring oscillator; and
a detector coupled to the ring oscillator and the crystal oscillator, wherein the detector detects a sudden impedance change across the crystal oscillator;
wherein the processor comprises:
a first switch coupled to the ring oscillator and the crystal oscillator;
a second switch coupled to the ring oscillator, crystal oscillator, and the detector; and
a finite state machine (FSM) to control the first and second switches, wherein the FSM is to close the first and second switches to start up the crystal oscillator, wherein the FSM is to cause the ring oscillator to freeze the frequency in response to an indication from the detector that a sudden impedance change across the crystal is detected.

12. The system of claim 11, wherein the crystal oscillator is on a package.

13. The system of claim 11, wherein:
the FSM is to wait for a predetermined or programmable time after the FSM is to cause the ring oscillator to freeze the frequency; and
the FSM is to open the first and second switches after the FSM is to wait for a predetermined or programmable time.

* * * * *